United States Patent
Tseng et al.

(10) Patent No.: US 10,076,039 B2
(45) Date of Patent: Sep. 11, 2018

(54) METHOD OF FABRICATING PACKAGING SUBSTRATE

(71) Applicant: Unimicron Technology Corporation, Taoyuan (TW)

(72) Inventors: Tzyy-Jang Tseng, Taoyuan (TW); Chung-W. Ho, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 98 days.

(21) Appl. No.: 14/539,312

(22) Filed: Nov. 12, 2014

(65) Prior Publication Data

US 2015/0068033 A1 Mar. 12, 2015

Related U.S. Application Data

(62) Division of application No. 13/542,914, filed on Jul. 6, 2012, now Pat. No. 8,912,642.

(30) Foreign Application Priority Data

Jul. 8, 2011 (TW) .............................. 100124361 A

(51) Int. Cl.
*H05K 3/00* (2006.01)
*H05K 3/46* (2006.01)
(Continued)

(52) U.S. Cl.
CPC ..... *H05K 3/0091* (2013.01); *H01L 23/49822* (2013.01); *H01L 23/49827* (2013.01);
(Continued)

(58) Field of Classification Search
None
See application file for complete search history.

(56) References Cited

U.S. PATENT DOCUMENTS 6,495,916 B1 * 12/2002 Ohuchi ............. H01L 21/76885
257/737
RE41,242 E 4/2010 Asai et al.
(Continued)

FOREIGN PATENT DOCUMENTS

CN 2560099 7/2003
CN 1791311 A 6/2006
(Continued)

*Primary Examiner* — Tom Thomas
*Assistant Examiner* — Steven B Gauthier
(74) *Attorney, Agent, or Firm* — JCIPRNET

(57) ABSTRACT

A method of fabricating a packaging substrate includes following steps: providing a carrier board having two opposite surfaces, forming on each of the surfaces a plurality of first metal bumps; covering the carrier board and the first metal bumps with a first dielectric layer that has a plurality of first intaglios which exposes a top surface and side surface of the first metal bumps; forming a conductive seedlayer on the first dielectric layer and the first metal bumps; forming a metal layer on the conductive seedlayer; removing a portion of the metal layer and the conductive seedlayer that is higher than the top surface of the first dielectric layer, and forming a first circuit layer in the first intaglios; forming a built-up structure on the first circuit layer and the first dielectric layer, forming a pair of upper and lower entire packaging substrates.

9 Claims, 6 Drawing Sheets

(51) Int. Cl.
  *H05K 3/40* (2006.01)
  *H01L 23/498* (2006.01)
  *H01L 23/00* (2006.01)

(52) U.S. Cl.
  CPC ......... *H05K 3/4007* (2013.01); *H05K 3/4647* (2013.01); *H05K 3/4682* (2013.01); *H05K 3/4685* (2013.01); *H01L 23/49816* (2013.01); *H01L 24/16* (2013.01); *H01L 2224/16225* (2013.01); *H01L 2224/32225* (2013.01); *H01L 2224/73204* (2013.01); *H01L 2924/12042* (2013.01); *H01L 2924/15311* (2013.01); *Y10T 29/49155* (2015.01)

(56) References Cited

U.S. PATENT DOCUMENTS

| | | | | |
|---|---|---|---|---|
| 2006/0121719 | A1* | 6/2006 | Nakamura | H01L 21/4857 438/613 |
| 2008/0298038 | A1* | 12/2008 | Kaneko | H01L 23/49811 361/808 |
| 2010/0132997 | A1* | 6/2010 | Hando | H01L 23/49816 174/262 |
| 2011/0097851 | A1* | 4/2011 | Hsu | H01L 21/4857 438/113 |

FOREIGN PATENT DOCUMENTS

| CN | 1889241 | | 1/2007 |
|---|---|---|---|
| CN | 1909226 | A | 2/2007 |
| CN | 101197344 | | 6/2008 |
| CN | 101295691 | | 10/2008 |

* cited by examiner

FIG. 2E"

METHOD OF FABRICATING PACKAGING SUBSTRATE

CROSS-REFERENCE TO RELATED APPLICATIONS

This application is a divisional of copending application U.S. Ser. No. 13/542,914, filed on Jul. 6, 2012, which claims under 35 U.S.C. § 119(a) the benefit of Taiwanese Application No. 100124361, filed Jul. 8, 2011, the entire contents of which are incorporated herein by reference.

FIELD OF THE INVENTION

The present invention relates to a packaging substrate and a method of fabricating the same, and, more particularly, to a coreless packaging substrate and a method of fabricating the same.

BACKGROUND OF THE INVENTION

With the rapid development of electronic industry, electronic products are gradually trending towards multifunction and high performance. Different package types have been developed in the current semiconductor package structures, such as wire-bonding package or flip-chip package. A semiconductor chip is disposed on a packaging substrate, and the semiconductor chip is electrically connected to the packaging substrate by bonding wires or solder bumps. In order to meet the packaging demands for highly integrated and miniaturized semiconductor package devices for connecting more active and passive components and wires, the packaging substrate is gradually evolved into a multi-layer board. Within the limited space of the packaging substrate, interlayer connection technology is available to expand circuit layout areas on the packaging substrate in order to meet the demands for high-density integrated circuits and reducing the thickness of the packaging substrate for achieving a low-profiled and compact-sized package structure, and also improving electrical functions.

In the prior art, a packaging substrate is constructed by a core board having the inner layer circuit and a circuit built-up structure symmetrically formed on both sides of the core board. It results in an increase in the thickness of the entire structure due to the use of the core board. Therefore, it is difficult to meet the demands for improving the functionality of electronic products and shrinking the volume of electronic products.

Accordingly, a coreless packaging substrate is developed for shortening the wire length and reducing the thickness of the entire structure, in order to meet the trend of high frequency and miniaturization. As shown in FIG. 1, a coreless packaging substrate 1 is formed by the following steps of: forming a first dielectric layer 120a on the carrier board (not shown), and forming a first circuit layer 11 on the first dielectric layer 120a; forming a circuit built-up structure 12 that has a second, a third, and a fourth dielectric layers 120b, 120c, 120d on the first dielectric layer 120a and the first circuit layer 11, the circuit built-up structure 12, and forming a second circuit layer 121 on the second to fourth dielectric layers 120b, 120c, 120d, wherein each second circuit layer 121 is electrically interconnected by conductive vias 122; removing the carrier board for exposing the first dielectric layer 120a;

forming a masking solder resist layer 14a, 14b on the first dielectric layer 120a, the fourth dielectric layer 120d, and the second circuit layer 121, respectively; forming an opening 140a in the solder resist layer 14a and the first dielectric layer 120a for exposing a portion of surface of the first circuit layer 11, and forming an opening 140b in the solder resist layer 14b for exposing a portion of surface of the second circuit layer 121; forming metal bumps 13a, 13b in the openings 140a, 140b, respectively, for combining solder balls 15a, 15b, wherein a chip (not shown) is disposed by the upside solder ball 15b. In other words, the aforementioned fabrication process gradually forms layers from the downside of the packaging substrate 1 (i.e., contacting with the surface of the carrier board) to the metal bump 13b and the solder resist layer 14b that are used for disposing a chip. That is to fabricate a packaging substrate from implanting solder balls to disposing a chip.

Among them, one curing process must be performed once whenever forming one dielectric layer. Consequently, the structure of the original semi-cured dielectric material can be cured. Further, the more the number of curing undergone by one dielectric layer is, the more complete the gathering and shrinking of molecules in the dielectric layer become.

All of the dielectric layers in the entire structure will be affected by the curing process each time. Therefore, the first dielectric layer 120a is cured four times, and the second, the third, and the fourth dielectric layers 120b, 120c, 120d are respectively curing three times, twice, and once.

In accordance with the above mentioned, the residual capability to gather and shrink of each dielectric layer is different due to the different curing number undergone by the first to the fourth dielectric layers 120a, 120b, 120c, 120d. Since the first dielectric layer 120a is curied most times, it hardly has any residual capability. That is, the residual capability of the second, the third, the fourth dielectric layers 120b, 120c, 120d is gradually increased in turn. In addition, since the residual capability of each dielectric layer of the packaging substrate will produce a stress pulling to the center from surroundings, the conventional packaging substrate 1 presents a warpage phenomenon showing a concave side from the fourth dielectric layer 120d and a convex side from the first dielectric layer 120a. That is, the chip-disposing side of the entire packaging substrate 1 presents a "smile"-like shape, which is a common feature in that kind of process. However, the substrate warpage phenomenon causes the fabrication of the packaging substrate and the subsequent package fabrication problems, thereby affecting the yield.

However, the solder resist layers 14a, 14b are respectively formed on the first dielectric layer 120a and the fourth dielectric layer 120d. Moreover, the opening 140a in the lower side of the solder resist layer 14a is greater than the opening 140b in the upper side of the solder resist layer 14b, and hence the actual coverage area of the lower side by the solder resist layer 14a is smaller than that of the upper side by the solder resist layer 14b. Consequently, the upper side of the solder resist layer 14b has more materials than the lower side of the solder resist layer 14a. The solder resist layer 14a, 14b both have molecule residual capability to gather and shrink. Therefore, the stress of the upper side of the solder resist layer 14b on the packaging substrate is greater than that of the lower side of the solder resist layer 14a. This will cause more serious degree of warpage of the packaging substrate 1.

According to the prior art, the solder resist layer and the outer circuit layer are not coplanar, and thus affecting the overall packaging yield and density.

Therefore, how to overcome warpage problems in the prior art is becoming one of the critical issues in the art.

SUMMARY OF THE INVENTION

In view of the warpage problems in the prior art, the present invention provides a packaging substrate, comprising: a first dielectric layer having a first surface and an opposite second surface; a plurality of first metal bumps embedded in the first surface of the first dielectric layer, each of the first metal bumps having a first end and an opposite second end, and the first surface exposing the second end of the first metal bump for a semiconductor chip to be disposed on the first metal bump; a first circuit layer embedded in and exposed from the second surface of the first dielectric layer, the first end of the first metal bump embedded in the first circuit layer, a conductive seedlayer disposed between the first circuit layer and the first dielectric layer, and between the first circuit layer and the metal bump; and a built-up structure disposed on the first circuit layer and the first dielectric layer, an outmost layer of the built-up structure having a plurality of conductive pads for an external electronic device to be disposed on the conductive pads.

The present invention further provides a method of fabricating a packaging substrate, comprising the steps of: providing a carrier board having two opposite surfaces, forming a plurality of first metal bumps having a first end and an opposite second end, and connecting the second end to the surface of the carrier board for disposing a semiconductor chip on the first metal bump; covering the surface of the carrier board and the first metal bump with a first dielectric layer that has a plurality of first intaglios for exposing a top surface and side surface of the first end of the first metal bump; forming a conductive seedlayer on the first dielectric layer and the first end of the first metal bump; forming a metal layer on the conductive seedlayer; removing a portion of the metal layer and the conductive seedlayer that are higher than the top surface of the first dielectric layer, and forming a first circuit layer in the first intaglios; forming a built-up structure on the first circuit layer and the first dielectric layer, forming a pair of upper and lower entire packaging substrates, and having a plurality of conductive pads on an outmost layer of the built-up structure for an external electronic device to be disposed on the conductive pads; and removing the carrier board for separating the pair of upper and lower entire packaging substrates to be two entire packaging substrates.

Accordingly, the packaging substrate of the present invention disposes a side of a chip which is connected to a side of an external electronic device. This will result in an "anti-smile"-like shape presented on the chip-disposing side of the entire packaging substrate; however, according to the removed area of the first dielectric layer (top dielectric layer) smaller than that of the bottom dielectric layer, the packaging substrate will produce a stress with a "smile"-like shape. Ultimately, the stress of the "smile"-like shape and the stress of the "anti-smile"-like shape will be offset, thereby making the entire packaging substrate more flat.

In addition, the fabricated packaging substrate of the present invention produces the conductive pads and the dielectric layer which are flush with the surface on the chip-disposing side. Consequently, it can increase the density of the conductive pads, and is conducive to a high-density packaging process.

Moreover, the present invention replaces the conventional masking solder resist layer with the dielectric layer, and thus making the material of each layer in the packaging substrate uniform and simplistic, but helping the entire packaging substrate to be more stable and smooth, and enhancing the yield.

Furthermore, the process of metal bumps of the present invention does not use the conventional laser ablation method. Although, the laser can improve the overall speed through adjustment, the laser can only create a via each time. As a result, the present invention can simultaneously form a plurality of metal bumps, and thus effectively reducing processing time and costs. Additionally, the present invention embeds the metal bumps in the circuit layer, and thus enhancing reliability of its combination.

BRIEF DESCRIPTION OF THE DRAWINGS

FIGS. 2E' and 2E" are other embodiments of FIG. 2E.

DETAILED DESCRIPTION OF THE INVENTION

The following illustrative embodiments are provided to illustrate the disclosure of the present invention; those skilled in the art can apparently understand these and other advantages and effects after reading the disclosure of this specification.

It should be noted that, the detailed description of the present invention refers to the accompanying drawings that illustrate the structure, proportion, size, etc. consistent with the present invention. Those skilled in the art can apparently understand these after reading the disclosure of this specification. However, it is understood that the scope of the present invention is not limited to the description. Numerous modifications and variations on the structure, proportion, or size may be made to the embodiments within the spirit and scope of the invention. Moreover, the terms, such as "upper," "a," and so on, cited in this specification facilitate understanding, rather than limit the scope of the present invention. The scope of the present invention should not be limited by any modification or adjustment in the absence of substantive changes to the technical contents.

Figure 1:
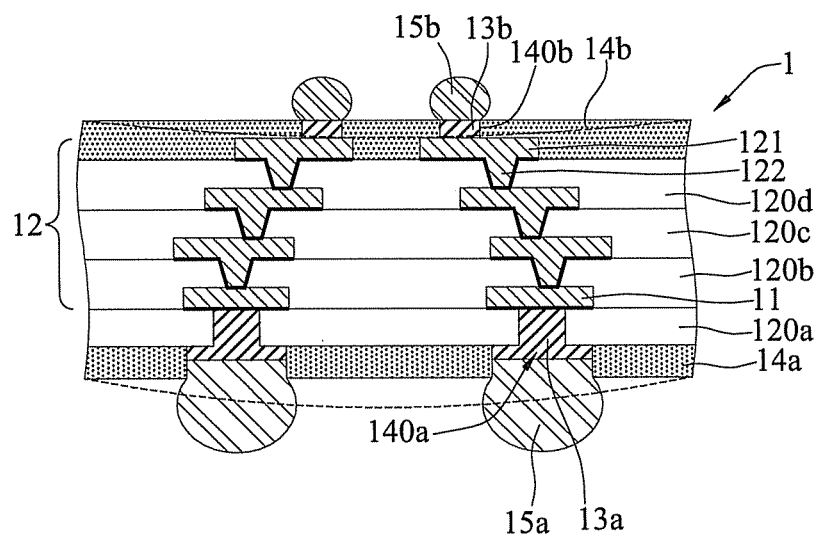
FIG. 1 is a cross-sectional diagram depicting a coreless packaging substrate according to the prior art.
Figure 2A:
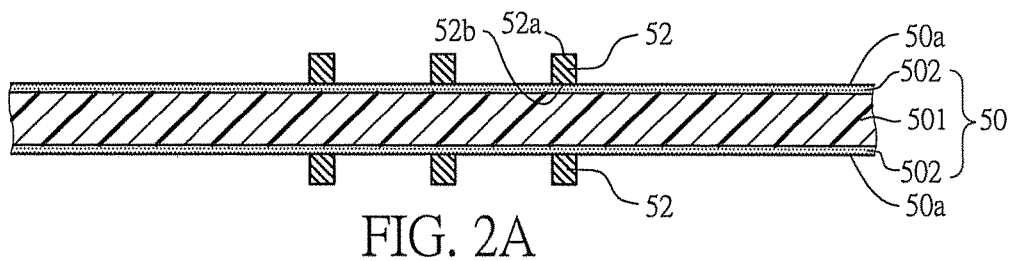
FIGS. 2A through 2K are cross-sectional diagrams depicting a coreless packaging substrate, embodiments, and a method of fabricating the same according to the present invention.
Figure 2B:
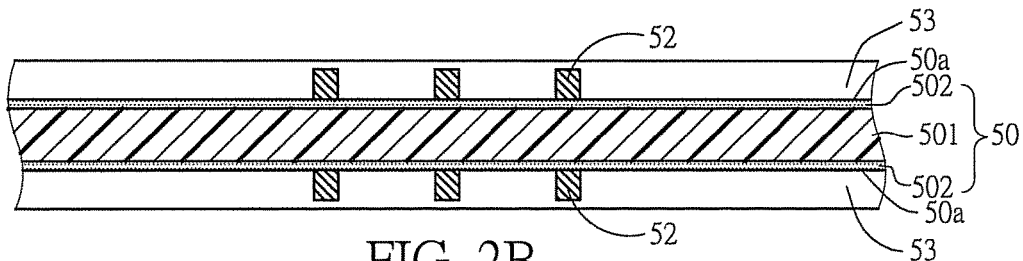
Figure 2C:
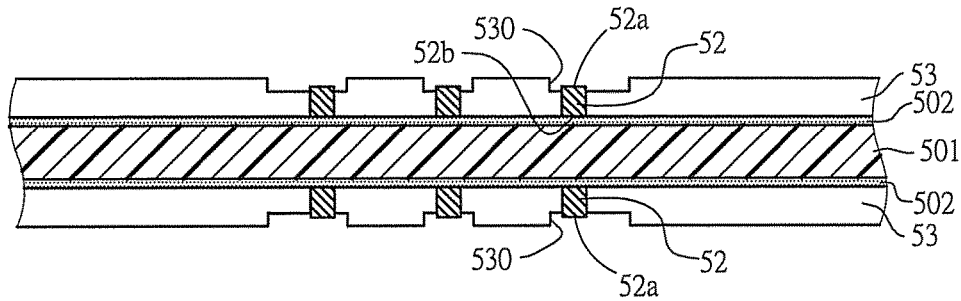
Figure 2D:
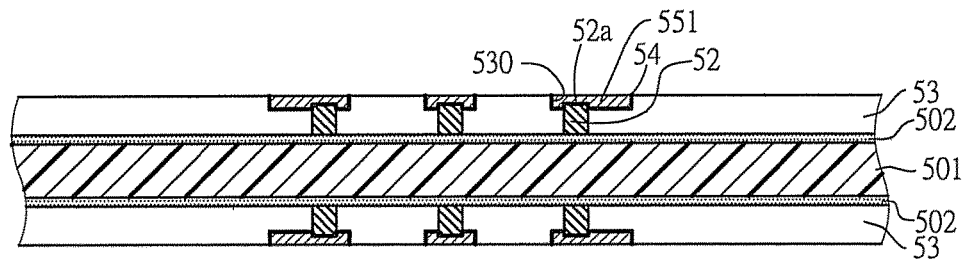
Figure 2E:
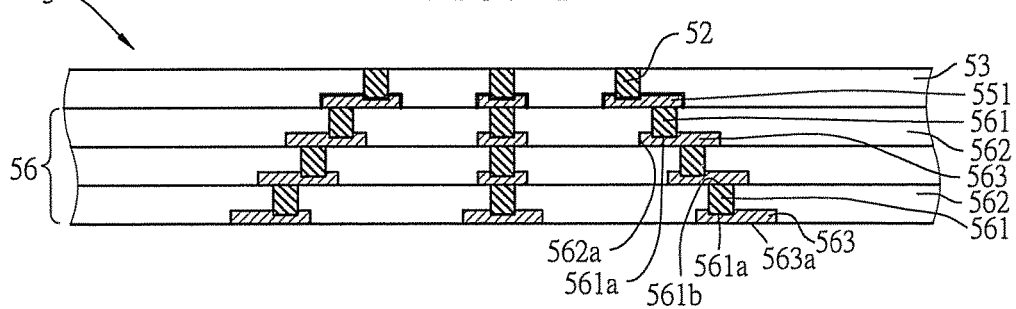
Figure 2E:
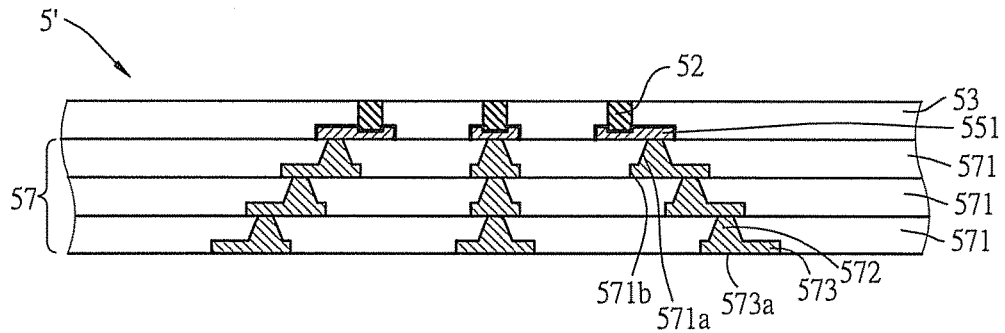

Referring now to FIGS. 2A through 2K, a packaging substrate, embodiments, and a method of fabricating the same according to the present invention are illustrated; FIG. 2E' and 2E" are other embodiments of FIG. 2E.

As shown in FIG. 2A, a carrier board 50 having a surface 50a and an opposite surface 50a is provided. A plurality of first metal bumps 52 having a first end 52a and an opposite second end 52b is disposed on each surface 50a, and the second end 52b on the surface 50a is connected to the carrier board 50 for disposing a semiconductor chip 59 on the first metal bump 52 (referring to FIG. 2G). According to the embodiment, the carrier board 50 further comprises a support layer 501 and an intermediate layer 502 disposed on two surfaces of the support layer 501 for forming the first metal bump 52 on the intermediate layer 502. According to an embodiment of the present invention, the material of the first metal bump 52 is formed by using copper, nickel, tin, gold, silver or copper-tin alloy, and the first metal bump 52 is formed by the additive method, semi-additive method (SAP), subtractive method, electroplating, electroless plating deposit, chemical deposition or printing method. However, various methods and materials for forming the metal bump are not limited to the above. As shown in FIG. 2B, the surface 50a of the carrier board 50 and the first metal bump 52a are covered with the first dielectric layer 53.

As shown in FIG. 2C, a plurality of first intaglios 530 is formed on the first dielectric layer 53 for exposing the top surface and side surface of the first end 52a of the first metal bump 52.

Figure 2F:
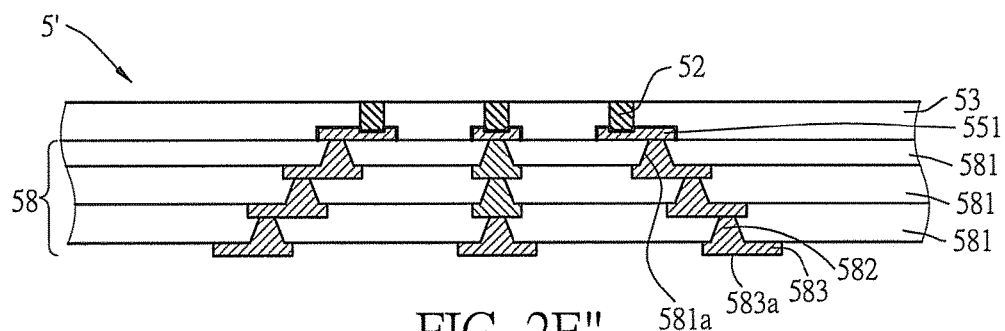
Figure 2F:
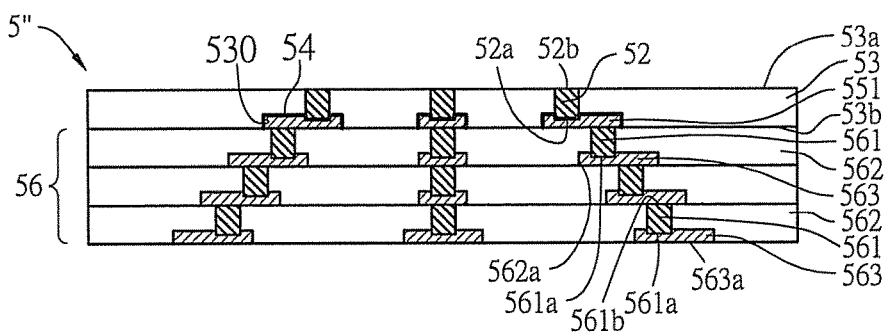
Figure 2G:
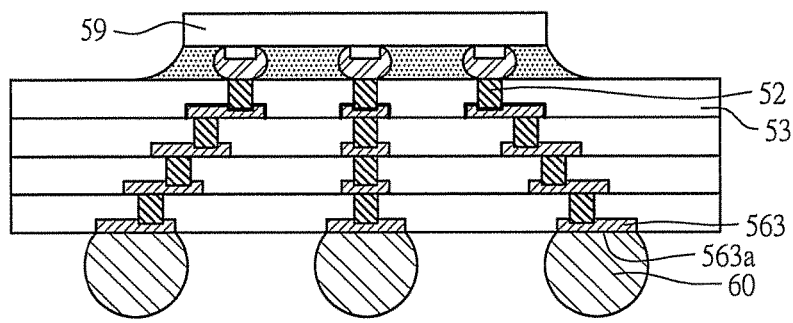
Figure 2H:
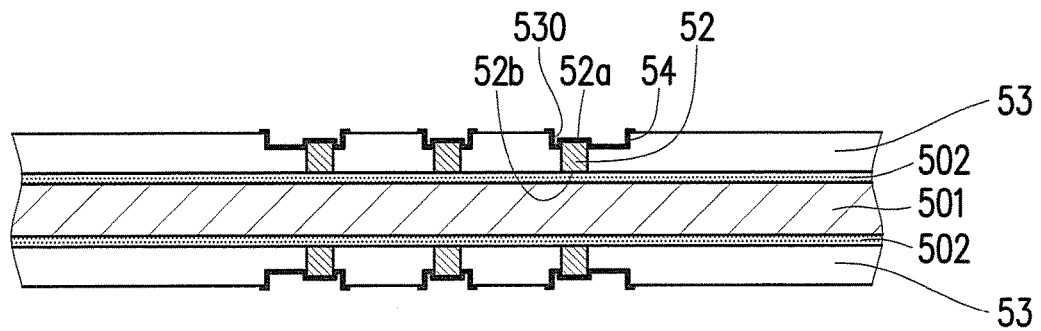
Figure 2I:
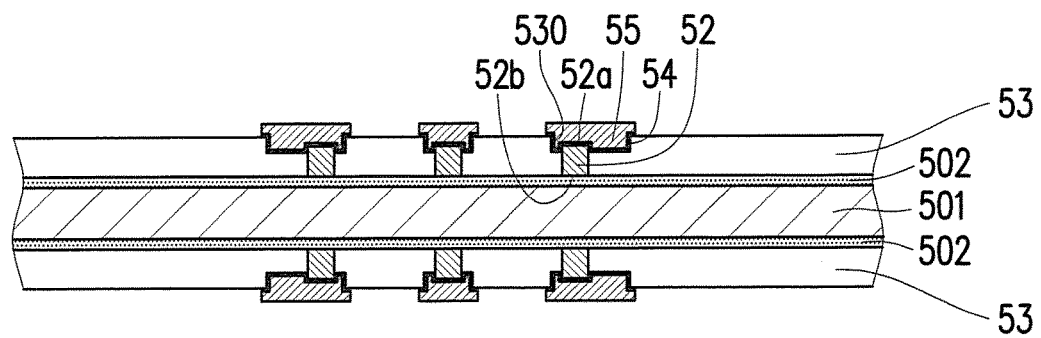

As shown in FIG. 2H, a conductive seedlayer 54 is formed on the first dielectric layer 53 and the first end 52a of the first metal bump 52, As shown in FIG. 2I, a metal layer 55 is formed on the conductive seedlayer 54. Consequently, a portion of the metal layer 55 and the conductive seedlayer 54 that are higher than the top surface of the first dielectric layer 53 are removed, and a first circuit layer 551 is formed in the first intaglios 530, as shown in FIG. 2D.

In addition to the aforementioned electroplating method, the first circuit layer 551 also can be formed by the following steps of: first, forming a mask layer (not shown) on the structure of FIG. 2B; then patterning the mask layer with a laser to form the first intaglios 530 of FIG. 2C; subsequently, comprehensively forming an active layer (not shown). There are many methods to form the active layer. In an embodiment of the present invention, the active layer can be formed by immersion plating. In detail, a plurality of metal particles is immersed in a chemical solution, and these metal particles can be adhered to the mask layer, the surfaces of the first intaglios 530, and the exposed top surface and side surface of the first end 52a, thereby forming the active layer. In an embodiment, the metal particles can be palladium particles, platinum particles, gold particles or silver particles, and the palladium particles come from chloride tin palladium colloid or sulfuric acid chelate palladium. Subsequently, the mask layer and the active layer thereon are removed. Finally, the first circuit layer 551 of FIG. 2D is formed on the active layer of the first intaglios 530 through chemical plating (i.e., electroless plating). In addition, the above circuit formation method can be applied to the embedded circuit of the present invention. Therefore, it will no longer repeat the description below.

Figure 2J:
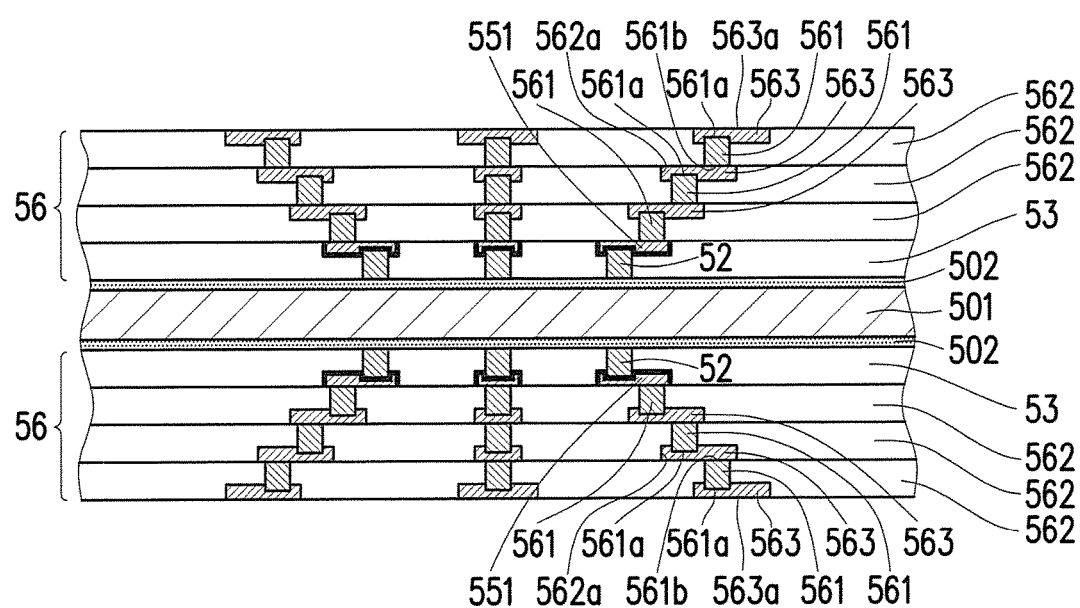
Figure 2K:
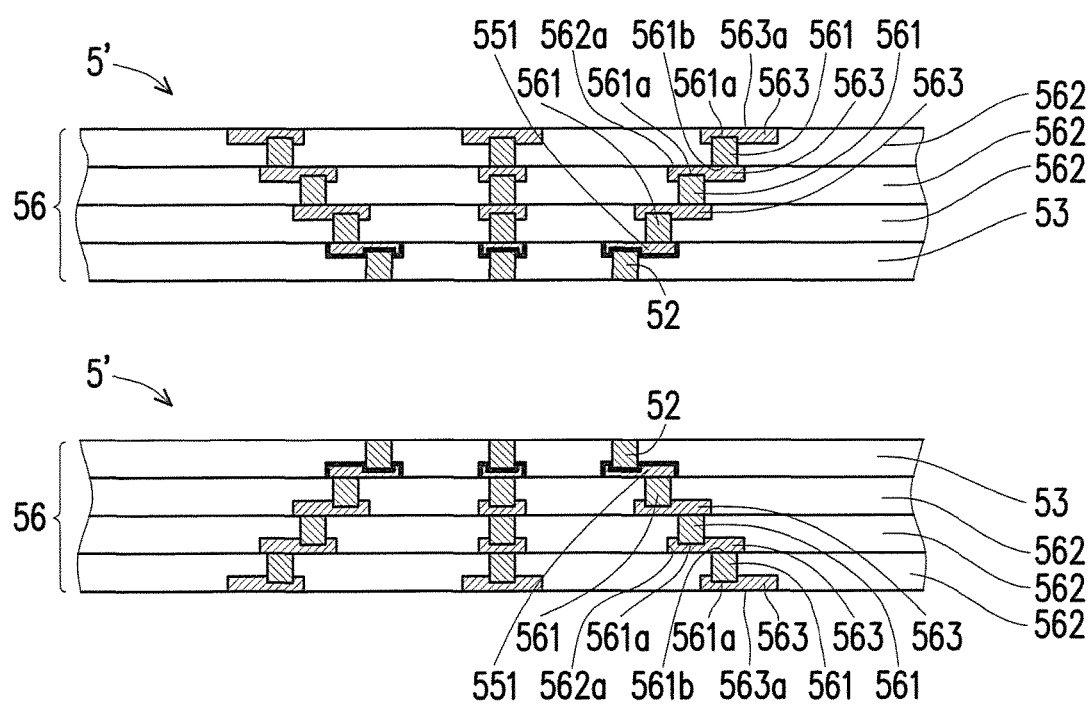

As shown in FIG. 2J, a second metal bump 561 is initially formed on the first circuit layer 551, and then the second dielectric layer 562 is formed on the first circuit layer 551, the second metal bump 561, and the first dielectric layer 53. A plurality of second intaglios 562a of the top surface and side surface of the third end 561a of the exposed second metal bump 561 is formed in the second dielectric layer 562, and subsequently, the second circuit layer 563 is formed in the second intaglios 562a. The aforementioned circuit built-up steps can be repeated as needed. The built-up structure 56 is formed on the first circuit layer 551 and the first dielectric layer 53. The built-up structure 56 comprises at least a second dielectric layer 562, a second circuit layer 563 embedded in and exposed from the surface of the second dielectric layer 562, and a second metal bump 561 formed in the second dielectric layer 562 and electrically connected to the first circuit layer 551 with the second circuit layer 563 or electrically connected to the second circuit layers 563. The second metal bump 561 has a third end 561a and an opposite fourth end 561b. The third end 561a of the second metal bump 561 is embedded in the second circuit layer 563, and the second circuit layer 563 of the outmost layer has a plurality of conductive pads 563a for disposing an external electronic device on the conductive pads 563a. A pair of upper and lower entire packaging substrates is formed. Afterwards, as shown in FIG. 2K, the carrier board 50 (as shown in FIG. 2B) is removed for separating the pair of upper and lower entire packaging substrates into two entire packaging substrates 5'. Finally, the entire packaging substrates 5' is obtained, as shown in FIG. 2E.

Alternatively, as shown in FIG. 2E', another embodiment of FIG. 2E is illustrated. The built-up structure 57 comprises at least a second dielectric layer 571, a second circuit layer 573 embedded in and exposed from the surface of the second dielectric layer 571, and a plurality of conductive vias 572 formed in the second dielectric layer 571 and electrically connected to the first circuit layer 551 and the second circuit layer 573 or electrically connected to the second circuit layers 573. Further, the second circuit layer 573 of the outmost layer has a plurality of conductive pads 573a. In addition, the process of the built-up structure 57 initially forms the second dielectric layer 571, and then forms vias 571a and second intaglios 571b in the second dielectric layer 571. The conductive vias 572 and the second circuit layer 573 are respectively formed in the vias 571a and the second intaglios 571b. It is not needed to repeat them here as other features are similar to that of FIG. 2E.

Alternatively, as shown in FIG. 2E", another embodiment of FIG. 2E' is illustrated. The built-up structure 58 comprises at least a second dielectric layer 581, a second circuit 583 formed on the second dielectric layer 581, and a plurality of conductive vias 582 formed in the second dielectric layer 581 and electrically connected to the first circuit layer 551 and the second circuit 583 or electrically connected to the second circuit layers 583. Further, the second circuit layer 583 of the outmost layer has a plurality of conductive pads 583a. The process of the built-up structure 58 initially forms the second dielectric layer 581, and then forms vias 581a in the second dielectric layer 581. The conductive vias 582 and the second circuit layer 583 are respectively formed in the vias 581a and the second dielectric layer 581. It is not needed to repeat them here as other features are similar to that of FIG. 2E', and the subsequent process is based on the embodiment of FIG. 2E.

It should be noted that, although the conductive seedlayer in the built-up structures 56, 57, 58 is not shown, the second circuit layers 563, 573, 583 are formed by the electroplating process of the conductive seedlayer, according to the embodiments of the present invention (i.e., similar to the steps of FIG. 2B through FIG. 2D).

As shown in FIG. 2F, the singulation process is performed to obtain a plurality of packaging substrates 5".

As shown in FIG. 2G, a semiconductor chip 59 is disposed on the first metal bump 52, and a solder ball 60 is formed on the conductive pad 563a.

It should be noted that, according to the aforementioned embodiment of the present invention, the packaging substrate 5" is obtained by the singulation process, and the semiconductor chip 59 is subsequently disposed; however, the semiconductor chip 59 can be firstly disposed, and then performing the singulation.

The present invention further provides a packaging substrate, comprising: a first dielectric layer 53 having a first surface 53a and an opposite second surface 53b; a plurality of first metal bumps 52 embedded in the first surface 53a of the first dielectric layer 53, wherein, each first metal bump 52 has a first end 52a and an opposite second end 52b, and the first surface 53a exposes the second end 52b of the first metal bump 52 for disposing the semiconductor chip 59 on the first metal bump 52; a first circuit layer 551 embedded in and exposed from the second surface 53b of the first dielectric layer 53, wherein, the first end 52a of the first metal bump 52 is embedded in the first circuit layer 551 and in between the first circuit layer 551, and a conductive seedlayer 54 is disposed between the first circuit layer 551 and the first metal bump 52; and built-up structures 56, 57, 58 disposed on the first circuit layer 551 and the first dielectric layer 53, wherein the outmost layer of the built-up structure 56, 57, 58 have a plurality of conductive pads 563a, 573a, 583a for disposing an external electronic device on the conductive pads 563a, 573a, 583a.

According to the aforementioned packaging substrate, the built-up structure 56 comprises at least a second dielectric layer 562, a second circuit layer 563 embedded in and exposed from the surface of the second dielectric layer 562, and a plurality of second metal bumps 561 formed in the second dielectric layer 562 and electrically connected to the first circuit layer 551 with the second circuit layer 563, or electrically connected to the second circuit layers 563, wherein the second metal bump 561 has a first end 561a and an opposite second end 561b, the first end 561a of the second metal bump is embedded in the second circuit layer 563, and the second circuit layer 563 of the outmost layer has the conductive pads 563a.

Further, according to the aforementioned packaging substrate, the built-up structure 57 comprises at least a second dielectric layer 571, a second circuit layer 573 embedded in and exposed from the surface of the second dielectric layer 571, and a plurality of conductive vias 572 formed in the second dielectric layer 571 and electrically connected to the first circuit layer 551 with the second circuit layer 573, or electrically connected to the second circuit layers 573, and the second circuit layer of the outmost layer having the conductive pads 573a.

According to the aforementioned packaging substrate, the built-up structure 58 comprises at least a second dielectric layer 581, a second circuit layer 583 disposed on the second dielectric layer 581, and a plurality of conductive vias 582 formed in the second dielectric layer 581 and electrically connected to the first circuit layer 551 with the second circuit layer 583, or electrically connected to the second circuit layers 583, and the second circuit layer 583 of the outmost layer having the conductive pads 583a.

Moreover, the aforementioned external electronic device of this specification can be a circuit board or other package structures.

To sum up, the packaging substrate of the present invention disposes a side of a chip which is connected to a side of the external electronic device. This will result in a stress with an "anti-smile"-like shape presented on the chip-disposing side of the entire packaging substrate; however, according to the removed area of the first dielectric layer (top dielectric layer) smaller than that of the bottom dielectric layer, the packaging substrate will produce a stress with a "smile"-like shape. Ultimately, the stress of the "smile"-like shape and the stress of the "anti-smile"-like shape will be offset, thereby making the entire packaging substrate more flat.

Additionally, the fabricated packaging substrate of the present invention produces the conductive pads and the dielectric layer which are flush with the surface on the chip-disposing side. Consequently, it can increase the density of the conductive pads, and is conducive to a high-density packaging process.

Moreover, the present invention replaces the conventional masking solder resist layer with the dielectric layer to make the material of each layer in the packaging substrate uniform and simplistic. It also enables the entire packaging substrate to be more stable and smooth, and thus enhancing the yield.

Furthermore, the metal bumping process of the present invention does not use the conventional laser ablation method. Although the laser can increase the overall speed through adjustment, the laser can only create a via each time. As a result, the present invention can simultaneously form a plurality of metal bumps, and thus effectively reducing processing time and costs. Additionally, based on the metal bump embedded in the circuit layer, the contact area between the circuit layer and the metal bump can be increased. Due to a better combination of the metal bump and the circuit layer, the overall reliability can be improved.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded to the broadest interpretation so as to encompass all such modifications and similar arrangements.

What is claimed is:

1. A method of fabricating a packaging substrate, comprising the steps of:
    providing a carrier board having two opposite surfaces, forming on each of the two opposite surfaces a plurality of first metal bumps having a first end and an opposite second end, and connecting the second end to the two opposite surfaces of the carrier board for a semiconductor chip to be disposed on the plurality of first metal bumps;
    covering the two opposite surfaces of the carrier board and the plurality of first metal bumps with a first dielectric layer that has a plurality of first intaglios which exposes a top surface and side surface of the first end of the plurality of first metal bumps;
    forming a conductive seedlayer on the first dielectric layer and the first end of the plurality of first metal bumps;
    forming a metal layer on the conductive seedlayer;
    removing a portion of the metal layer and the conductive seedlayer such that the top surface is co-planar with a top surface of the first dielectric layer which is opposite the carrier board, and the result of the removal of the portion of the metal layer and the conductive seed layer, forming a first circuit layer in the plurality of first intaglios;
    forming a built-up structure on the first circuit layer and the first dielectric layer, forming a pair of upper and lower entire packaging substrates, and having a plurality of conductive pads on an outmost layer of the built-up structure for an external electronic device to be disposed on the plurality of conductive pads; and
    removing the carrier board results in the pair of upper and lower entire packaging substrates.

2. The method of claim 1, further comprising performing a singulation process results in the pair of upper and lower entire packaging substrates.

3. The method of claim 1, wherein the carrier board further comprises a support layer, and an intermediate layer disposed on two surfaces of the support layer, wherein the plurality of first metal bumps and the first dielectric layer are formed on the intermediate layer.

4. The method of claim 1, wherein the built-up structure comprises at least a second dielectric layer, a second circuit layer embedded in and exposed from the surface of the second dielectric layer, and a plurality of second metal bumps formed in the second dielectric layer and electrically connected the first circuit layer and the second circuit layer, or electrically connected to the second circuit layer, wherein the plurality of second metal bumps has a third end and an opposite fourth end, the third end of the plurality of second metal bumps is embedded in the second circuit layer, and the second circuit layer of the outmost layer has the plurality of conductive pads.

5. The method of claim 4, wherein the process of the built-up structure firstly forms the plurality of second metal bumps, and subsequently forms the second dielectric layer, forming a plurality of second intaglios of the top surface and side surface of the third end of the plurality of second metal bumps in the second dielectric layer, and forming the second circuit layer in the plurality of second intaglios.

6. The method of claim 1, wherein the built-up structure comprises at least a second dielectric layer, a second circuit layer embedded in and exposed from the surface of the second dielectric layer, and a plurality of conductive vias formed in the second dielectric layer and electrically connected to the first circuit layer and the second circuit layer, or electrically connected to the second circuit layer, wherein the second circuit layer of the outmost layer has the conductive pads.

7. The method of claim 6, wherein the process of the built-up structure firstly forms the second dielectric layer, and subsequently forms the vias and the second intaglios in the second dielectric layer, and the conductive vias and the second circuit layer are formed on the vias and the second intaglios, respectively.

8. The method of claim 1, wherein the built-up structure comprises at least a second dielectric layer, a second circuit layer formed on the second dielectric layer, and a plurality of conductive vias formed in the second dielectric layer and electrically connected to the first circuit layer with the second circuit layer, or electrically connected to the second circuit layer, wherein the second circuit layer of the outmost layer has the conductive pads.

9. The method of claim 8, wherein the process of the built-up structure firstly forms the second dielectric layer, and subsequently forms vias in the dielectric layer, the conductive vias and the second circuit layer respectively formed on the vias and the second dielectric layer.

* * * * *